United States Patent [19]

Burger, Jr. et al.

[11] Patent Number: 5,412,346
[45] Date of Patent: May 2, 1995

[54] VARIABLE GAIN VOLTAGE SIGNAL AMPLIFIER

[75] Inventors: Harley F. Burger, Jr., Mertztown, Pa.; John M. Khoury, New Providence, N.J.; Tandur L. Viswanathan, Kempton, Pa.

[73] Assignee: AT&T Corp., Murray Hill, N.J.

[21] Appl. No.: 166,488

[22] Filed: Dec. 13, 1993

[51] Int. Cl.$^6$ ............................................. H03G 3/20
[52] U.S. Cl. ..................................... 330/282; 330/86; 330/110
[58] Field of Search .................. 330/86, 258, 110, 282

[56] References Cited

U.S. PATENT DOCUMENTS 4,216,434  8/1980  Wermuth ......................... 330/282 X
4,509,019  1/1983  Bann et al. ............................ 330/107

OTHER PUBLICATIONS

Dickey, "Photocoupler Provides ABC for Audio Communications", *Electronics*, Jan. 22, 1976, pp. 97, 99.
Moerschell, "Gated Operational Amplifiers", *IBM Technical Disclosure Bulletin*, vol. 12, No. 1, Jun. 1969 pp. 30, 31.
Patent Application Ser. No.: 07/954,839, filed Sep. 30, 1992, Nagaraj, et al., "Multiple Control Voltage Generation for MOSFET Resistgnee": AT&T Bell Laboratories, Murray Hill, N.J.
IEEE 1990 Custom Integrated Circuits Conference, "CMOS Amplifiers Incorporating a Novel Slew Rate Enhancement Technique" by K. Nagaraj, AT&T Bell Laboratories, Murray Hill, New Jersey 07974, pp. 11.6.1–11.6.5.
Silicon Systems 1990 Data Book, Microperipheral Products Integrated Circuits, "Pulse Detector and Data Separator," pp. 2–135–136.
AT&T Microelectronics Advance Data Sheet, Sep. 17, 1992, pp. 1,8,50 and 51, "ATT91C020/25 Read Channel Device (REACH2)".
An Introduction to Electronics by William G. Oldham and Steven E. Schwarz, "Operational Amplifiers and Their Applications", pp. 498–546, published by Holt, Rinehart and Winston, Inc., Copyright 1972.
An Introduction to Direct Access Storage Defvices by Hugh M. Sierra, "Read/Write Channel" Chapter 8, pp. 151–185, published by Academic Press, Inc., copyright 1990.

*Primary Examiner*—James B. Mullins
*Attorney, Agent, or Firm*—Howard A. Skaist

[57] ABSTRACT

A variable gain voltage signal amplifier is provided for incorporation in an automatic gain control circuit, such as for a disk drive. The variable gain voltage signal amplifier comprises: an amplifier including an inverting input voltage signal terminal and an output voltage signal terminal. The amplifier includes an input signal path coupled to the input voltage signal terminal and further includes a feedback signal path coupling between the input voltage signal terminal and the output voltage signal terminal. The input signal path comprises a capacitor coupled in series with a resistor, and the feedback signal path comprises a resistor. At least one of the resistors comprises an electronic signal-controlled resistor.

18 Claims, 5 Drawing Sheets

VARIABLE GAIN VOLTAGE SIGNAL AMPLIFIER

RELATED APPLICATION

This patent application is related to U.S. patent application Ser. No. 7/954839, entitled "Multiple Control Voltage Generation For MOSFET Resistors," by K. Nagaraj et al., filed Sep. 30, 1992, assigned to the assignee of the present invention and herein incorporated by reference.

1. Field of the Invention

The invention relates to a variable gain voltage signal amplifier incorporated in an automatic gain control (AGC) circuit.

2. Background of the Invention

Variable gain voltage signal amplifiers may be employed in electronic circuits that read signals or information stored on a disk or diskette, such as those used in a computer or other disk drive. Due to the operation of the disk drive to read the stored signals from the disk or diskette, usually by electromagnetic induction, such as described in *An Introduction to Direct Access Storage Devices*, written by Hugh M. Sierra, published by Academic Press, Inc., (1990), and herein incorporated by reference, a variable gain voltage signal amplifier employed in the disk drive should have the capability to accommodate a potentially wide range of input voltage signal amplitudes. See, for example, chapters 2, 3 and 8 of the Sierra text. More particularly, the disk drive head typically floats over the surface of the disk and, therefore, may operate over a range of standoff distances from the surface of the disk. The amplitude of the voltage signal produced for the disk drive electronic circuitry may, therefore, vary over a range of voltage signal amplitudes. Furthermore, typically the variable gain amplifier (VGA) is employed in an automatic gain control (AGC) circuit. The AGC circuit usually includes a high-pass resistor-capacitor (RC) network or other high-pass filter to remove undesired direct current (DC) voltage signal offsets that may appear in the signal loop of the AGC circuit. Typically, this high-pass filter is coupled to the output terminals of the variable gain voltage signal amplifier that provide an output voltage signal.

One problem associated with the use of a high-pass filter in AGC circuitry, as described above, is that changes in the input voltage signal amplitude provided to the VGA as a result of the operation of the disk drive, also as previously described above, generally results in changes in the DC offset of the output voltage signal provided to the high-pass filter by the VGA. This occurs because the gain of the amplifier is changed or adjusted by the AGC loop; When this occurs, the high-pass filter requires time to resettle. This may adversely affect the operation of the AGC control circuit or loop and, likewise, the disk drive for several reasons.

First, it introduces an undesirable time delay. Typically, the time constant for the high-pass filter is longer than the time constant for the AGC loop filter. This time delay, therefore, reduces the overall performance of the AGC circuit by affecting its speed of adaption. Furthermore, depending upon the particular circuitry, changes in the DC offset of the output voltage signal provided by the VGA to the high-pass filter may actually result in unstable AGC circuit operation.

In addition to the previous problems associated with the an AGC loop for a disk drive, it is also desirable to have the capability to "squelch" the operation of the VGA. This capability enhances the performance of the disk drive when alternating between reading signals and writing signals because typically the VGA is not needed for the disk drive to "write" signals or information to the disk or diskette. Again, squelching the VGA typically will result in undesirable changes in the DC offset of the output voltage signal provided by the VGA to the high-pass filter network in the AGC circuit. Thus, several of the problems described above may likewise be introduced due to squelching the VGA. A need, therefore, exists for a VGA incorporated in an AGC circuit for use in a disk drive that diminishes at least some of the undesirable aspects of the foregoing problems.

SUMMARY OF THE INVENTION

Briefly, in accordance with one embodiment of the invention, a variable gain voltage signal amplifier, incorporated in an AGC circuit, such as for use in a disk drive, comprises: an amplifier including an inverting input voltage signal terminal and an output voltage signal terminal. The amplifier includes an input signal path coupled to the input voltage signal terminal and a feedback signal path coupling between the input voltage signal terminal and the output voltage signal terminal. The input signal path comprises a capacitor coupled in series with a resistor and the feedback signal path comprises a resistor. At least one of the resistors comprises an electronic signal-controlled resistor.

BRIEF DESCRIPTION OF THE DRAWINGS

The subject matter regarded as the invention is particularly pointed out and distinctly claimed in the concluding portion of the specification. The invention, however, both as to organization and method of operation, together with objects and advantages thereof, may best be understood by reference to the following detailed description when read with the accompanying drawings in which:

DETAILED DESCRIPTION

Figure 1:
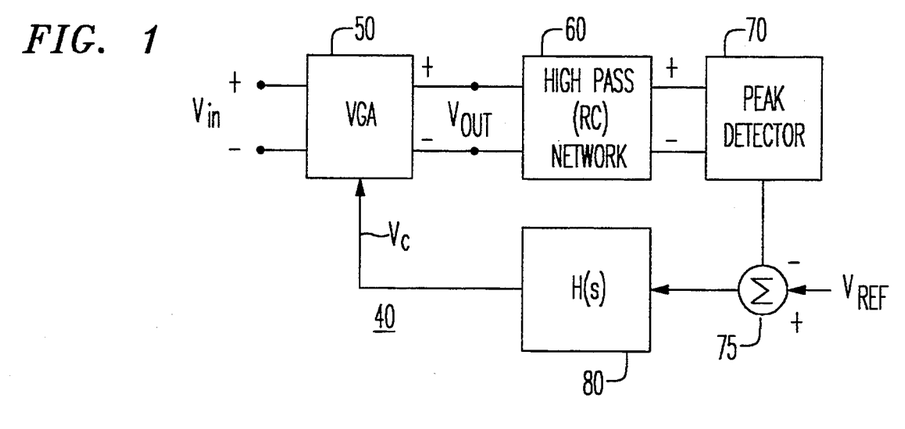
FIG. 1 is a block diagram of one embodiment of an automatic gain control (AGC) circuit incorporating a variable gain amplifier (VGA), such as for use in a disk drive.

FIG. 1 is a block diagram of an automatic gain control (AGC) circuit or control signal loop 40, such as may be employed in a disk drive as pan of the electrical or electronic circuitry used for "reading" signals or information from a disk or diskette. As will be explained in more detail hereinafter, this circuit or signal loop is typically disabled when "writing" signals or information to a disk or diskette. In this context, an AGC circuit or signal loop is used because the input voltage signal may have a potentially large dynamic range of magnitudes due to the technique employed by the disk drive head (not shown) to obtain the signals or information that may be stored on the disk. In particular, electromagnetic induction may be employed and the disk drive head, which does not typically directly contact the disk, may float over a range of possible standoff distances from the surface of the disk. This potential variation in standoff distance may affect the voltage signal amplitude levels obtained or provided to the disk drive circuitry. Nonetheless, the electronic circuits in the disk drive that process the signals or information obtained typically operate at a substantially predetermined voltage signal level amplitude or magnitude. Therefore, AGC circuitry, such as illustrated in FIG. 1, is employed to adjust the signal amplitude level of the voltage output signals obtained from the disk drive head before the signals are further processed by the disk drive electronic circuitry. Typically, as illustrated, AGC circuit 40 includes a VGA 50 in which the amplifier gain may be controlled by adjusting a control voltage, $V_c$. In AGC circuit 40, the output voltage signal of VGA 50, $V_{out}$, is typically provided to a high-pass filter or RC network 60 to remove any direct current (DC) output voltage signal offset that may be present in the output voltage signal produced by VGA 50. Likewise, the filtered voltage signal is then provided to a peak detector 70 and the output voltage signal of the peak detector is compared to a reference voltage signal, $V_{ref}$, at node 75. The difference in the voltage signals is then fed to AGC loop filter 80, typically implemented as a conventional integrator, illustrated as having a Laplace transfer function $H(s)$.

As illustrated, the output voltage signal of filter or integrator 80 provides the control voltage $V_c$ for VGA 50. Thus, if the input voltage signal, $V_{in}$, has a signal amplitude level that is higher than desirable for the disk drive circuitry, the effect of the AGC circuitry is to reduce the gain of the VGA until the output voltage signal provided by the peak detector is substantially equal to $V_{ref}$. Likewise, the opposite effect is accomplished by AGC circuit 40 if the signal voltage amplitude level of the input voltage signal, $V_{in}$, is too low.

Figure 2:
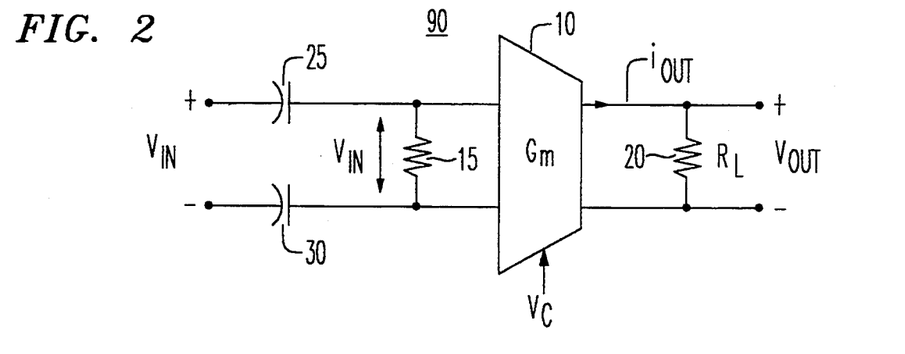
FIG. 2 is a circuit diagram of one possible embodiment of a variable gain voltage signal amplifier.

One problem associated with the use of VGAs, such as VGA 50 illustrated in FIG. 1, in an AGC circuit, such as AGC circuit 40 also illustrated in FIG. 1, is the presence of large DC voltage offsets in the output voltage signal of the VGA. This problem is illustrated by the circuit diagram in FIG. 2 of an embodiment 90 of a VGA configuration. As illustrated, a transconductance amplifier 10 has a fixed resistor or resistance 15 coupled across the two input voltage signal terminals of amplifier 10. In the context of the invention, a resistor refers to a device, or a combination of devices, that provide an effective resistance, although it is not restricted to providing a fixed or non-varying resistance. Likewise, respective capacitors 25 and 30 are coupled to the respective input voltage signal terminals of the VGA and thereby provide an input voltage signal, $V_{in}$, to the VGA. A load resistor or resistance 20, designated $R_L$ in FIG. 2, is likewise coupled across the output voltage signal terminals of the amplifier to provide an output voltage signal, $V_{out}$. Based on the operation of a conventional transconductance amplifier, the output current signal, $I_{out}$, provided by the amplifier is equal to the gain of the amplifier, designated $G_m$ in FIG. 2, times the input voltage signal, $V_{in}$. Likewise, $$V_{out} = R_L I_{out} \qquad [1]$$
$$= G_m R_L V_{in}$$

Although not illustrated in FIG. 2, a conventional transconductance amplifier includes an input "referred" internal offset voltage, $V_{os}$, that is superpositioned with $V_{in}$ during amplifier operation. Therefore, this input "referred" offset voltage signal is also multiplied by the gain of the amplifier, along with the input voltage signal, $V_{in}$. Likewise, because the gain of the amplifier is adjusted by adjusting the control voltage, $V_c$, a DC offset voltage appearing in the voltage output signal, $V_{out}$, is dependent on the gain of the amplifier, which will typically vary when employed in an AGC circuit for a disk drive, such as illustrated in FIG. 1.

Problems associated with the use of such a VGA are illustrated by reconsidering the block diagram of FIG. 1. When the gain of VGA 50 is varied, the DC output voltage offset produced by the VGA changes and, due to the transient behavior of high-pass network 60, the network must take time to resettle. This may either slow down or severely complicate the operation of AGC circuit 40. Typically the high-pass network employs capacitors of sufficiently high capacitance values to perform effective alternating current (AC) "blocking" of the DC and low frequency signal components. As a result, AGC filter 80 typically has a shorter, or faster, time response than that of high-pass network 60. Thus, the gain adjustment accomplished using the VGA illustrated in FIG. 2 ultimately slows down the response of the overall AGC circuit. Furthermore, depending upon the particular AGC circuit, the situation previously described may even lead to instability of the AGC circuit itself.

Figure 3:
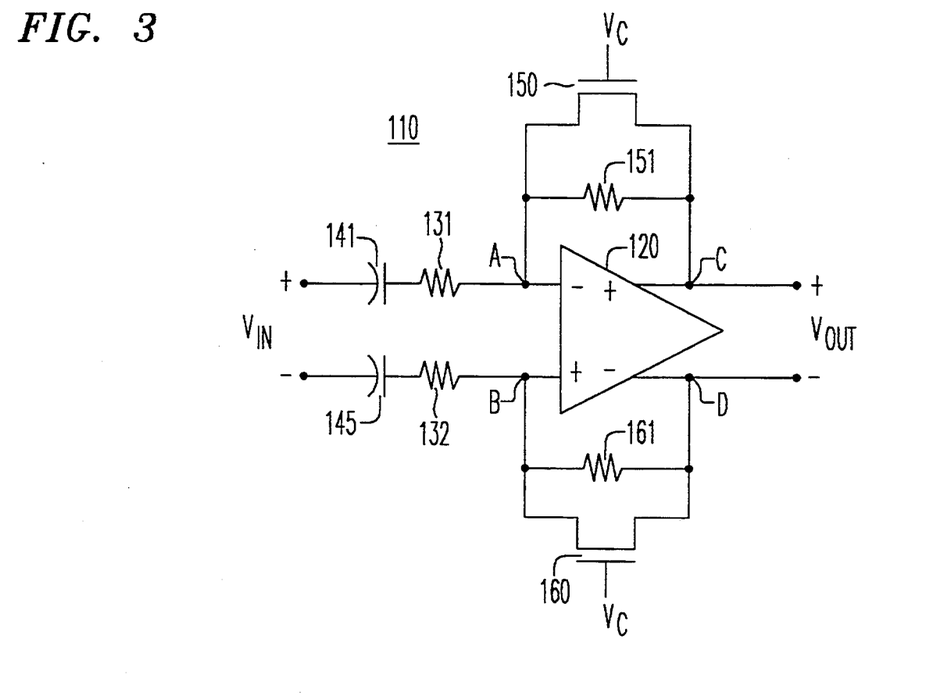
FIG. 3 is a circuit diagram of one embodiment of a variable gain voltage signal amplifier in accordance with the invention.

One embodiment of a variable gain voltage signal amplifier 110 in accordance with the invention is illustrated in FIG. 3. Although not illustrated in FIG. 3, such a VGA may be incorporated in an AGC circuit for use in a disk drive, such as the AGC circuit previously described and illustrated in FIG. 1. As will be described in more detail hereinafter, the configuration of amplifier 110 has the desirable attribute of varying the gain between the AC input voltage signal and the AC output voltage signal of the variable gain voltage signal amplifier without substantially affecting the magnitude of the DC voltage offset of the output voltage signal of the variable gain voltage signal amplifier. As illustrated in FIG. 3, in this particular embodiment, VGA 110 comprises a conventional balanced, or fully-differential, operational amplifier 120 including inverting and non-inverting input voltage signal terminals, A and B, respectively, and inverting and non-inverting output voltage signal terminals, C and D, respectively. Balanced amplifier 120 further includes a first input signal path coupled to the inverting input voltage signal terminal, that path comprising a capacitor 14 1 coupled in series with a fixed resistor 131. Likewise, balanced amplifier 120 includes a second input voltage signal path coupled to the non-inverting input signal terminal, that input voltage signal path comprising a capacitor 145 coupled in series with a fixed resistor 132. Balanced amplifier 120 further includes first feedback signal path coupling between the inverting input voltage signal terminal and the non-inverting output voltage signal terminal, that feedback signal path including a resistor, or resistance. In this embodiment, the resistor in the first feedback signal path is implemented as a resistor network configuration of a fixed or non-varying resistance 151 coupled in parallel with an electrical or electronic signal-controlled resistor 150. Furthermore, the electronic-signal controlled resistor 150 comprises a metal oxide semiconductor (MOS) device in this particular embodiment. Likewise, balanced amplifier 120 further includes a second feedback path coupling between the non-inverting input voltage signal terminal and the inverting output voltage signal terminal. Again, the second feedback signal path includes a resistor implemented as a resistor network configuration of a fixed resistor 161 coupled in parallel with an electronic signal-controlled resistor 160, in this particular embodiment an MOS device.

In the context of the invention, the first signal path refers to the first input signal path and the first feedback signal path, whereas the second signal path refers to the second input signal path and the second feedback signal path. FIG. 3 illustrates only one possible embodiment within the scope of the present invention. More particularly, it is sufficient if at least one of the resistors in the first signal path and one of the resistors in the second signal path comprise an electronic signal-controlled resistor. The advantages associated with such a configuration of a variable gain voltage signal amplifier are explained in more detail hereinafter.

For convenience only, it is assumed that fixed resistor 131 has substantially the same resistance as fixed resistor 132 and that, likewise, fixed resistor 151 has substantially the same resistance as fixed resistor 161. The invention is not limited in scope in this particular manner. Likewise it is assumed only for convenience, without any limitation in scope, that MOS devices 150 and 160 have substantially identical channel resistances, $R_{ds}$. $R_{ds}$ may be given by the following formula:

$$R_{ds} = \frac{1}{K(V_c - V_{cmo} - V_T)} \quad [2]$$

where $V_{cmo}$ is the common mode bias voltage of the amplifier, $V_T$ is the threshold voltage of the MOS device, and K is an arbitrary constant that depends on the particular MOS device. Thus, if R 1 designates the resistance of resistors 131 and 132 and R2 designates the resistance of resistors 151 and 161, it may be demonstrated that the AC voltage signal gain of the circuit illustrated in FIG. 3 is given by the following formula:

$$\text{GAIN} = -\frac{R_2 \parallel R_{ds}}{R_1}$$

where "$\parallel$" designates the well-known algebraic formula for computing the total resistance of two parallel resistances.

Thus, as is desired for a VGA, the gain may be controlled by adjusting the control voltage, $V_c$, to adjust or modify resistance $R_{ds}$. Furthermore, the DC offset of the output voltage signal, $V_{out}$, is substantially independent of the gain of the VGA, and, likewise, $V_c$. In the context of the invention, as suggested previously, this gain is therefore termed the "AC voltage signal gain." The relationship between the DC voltage input signal and the DC voltage output signal for VGA 110 may be illustrated by observing that capacitors 141 and 145 after a certain period of time will charge to a substantially constant voltage signal level, equivalent, in combination, to the input "referred" internal offset voltage, $V_{os}$, of balanced amplifier 120. Likewise, the capacitance value of capacitors 141 and 145 should each be sufficiently high so that the impedance of the capacitors is negligible in comparison with the resistance value coupled in series with each capacitor when processing alternating current signals within a predetermined frequency range. Furthermore, each capacitor provides an effective capacitance sufficient to substantially filter out DC voltage signals and low frequency AC voltage signals outside the relevant range of frequencies for the AGC circuit. By this technique, in equilibrium or steady state, adjusting the gain of the amplifier configuration by adjusting $V_c$ should have substantially no effect on the DC offset of the voltage output signal produced by the VGA. Furthermore, the DC offset of the voltage output signal shall substantially equal the offset voltage internal to the balanced amplifier, $V_{os}$. It will now be appreciated that the voltage signal levels previously described apply only for the DC component of the output voltage signal and not the AC component of the output voltage signal. Thus, the AC voltage signal gain is affected by varying the effective resistance of the electronic signal-controlled resistor, $R_{ds}$ in this embodiment, as described.

Figure 4:
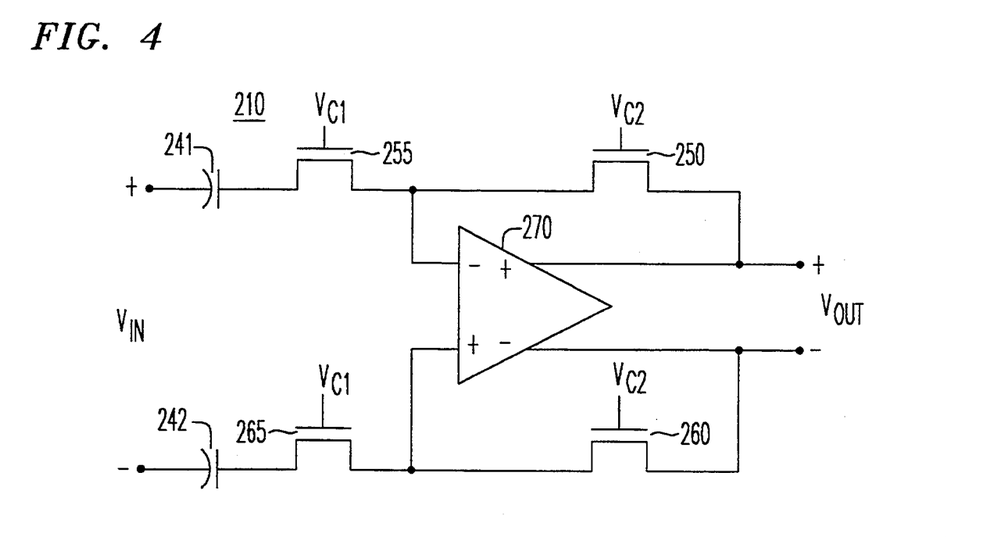
FIG. 4 is a circuit diagram of an alternative embodiment of a variable gain voltage signal amplifier in accordance with the invention.

FIG. 4 is a circuit diagram of yet another alternative embodiment of a variable gain voltage signal amplifier 210 in accordance with the invention. One aspect of the embodiment illustrated in FIG. 4 is that the VGA may be implemented using all MOS devices and, thus, the AGC circuit may comprise an MOS integrated circuit (IC) that incorporates such an embodiment of a VGA in accordance with the invention. Likewise, such an MOS IC may conveniently be incorporated in a disk drive system. As illustrated, the resistors in the first and second input signal paths and the resistors in the first and second feedback signal paths each comprise electronic signal-controlled resistors, in this particular embodiment MOS devices 255 and 265 in the respective input signal paths and MOS devices 250 and 260 in the respective feedback signal paths. Likewise, the first and second input signal paths each respectively include a capacitor, 241 and 242, in series with the electronic signal-controlled resistor for that signal path. It may be shown that the magnitude of the AC voltage signal gain of the embodiment illustrated in FIG. 4 is substantially in accordance with the following formula:

$$|\text{GAIN}| = \frac{K_1(V_{c1} - V_{cmo} - V_T)}{K_2(V_{c2} - V_{cmo} - V_T)} \quad [4]$$

Thus, the AC voltage signal gain may be controlled by adjusting either $V_c$, $V_{c2}$, or both, as illustrated in FIG. 4. For convenience only, without any limitation in scope, it is assumed in equation [4] that the threshold voltages for the MOS devices are substantially identical.

Figure 6:
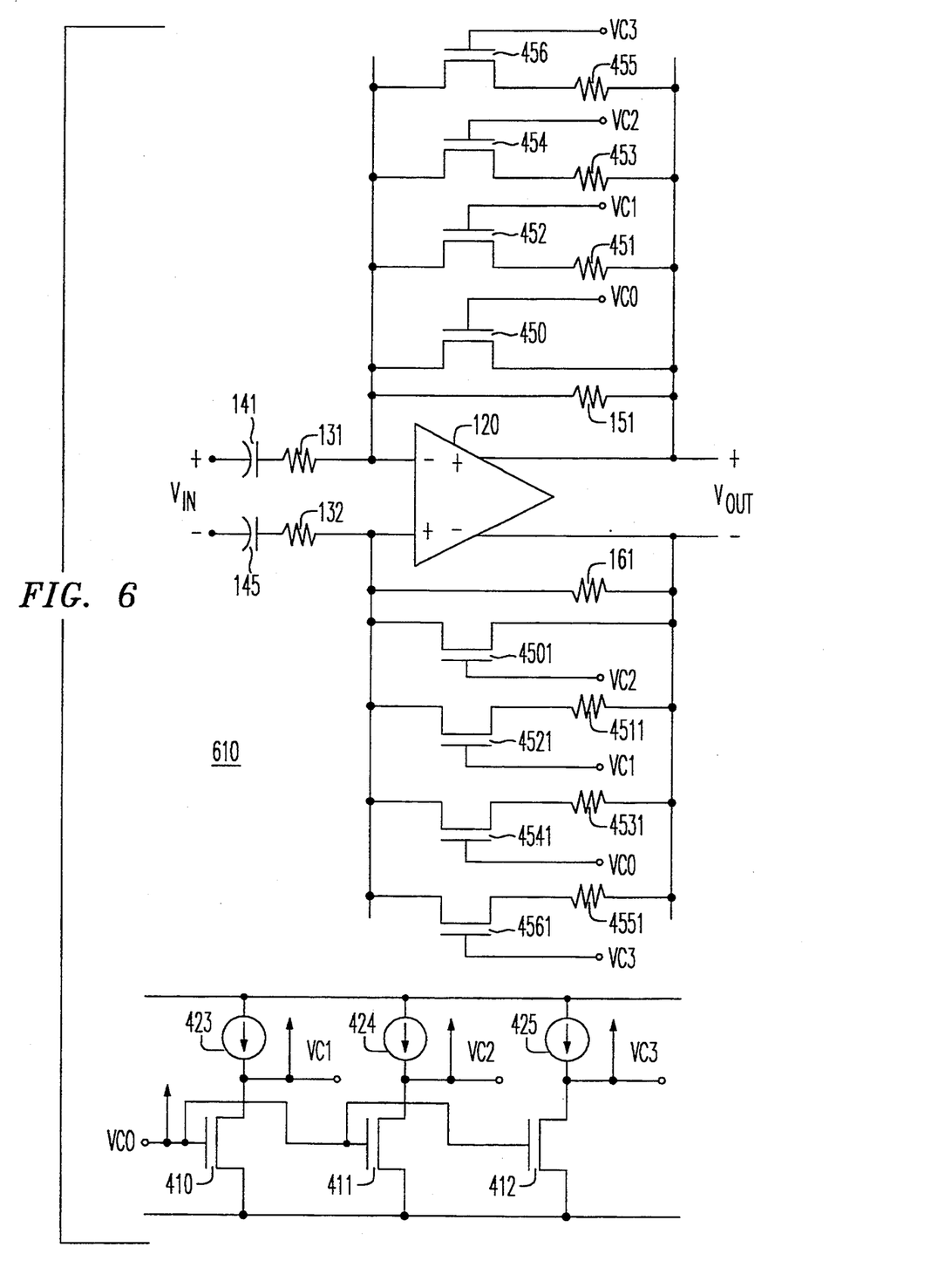
FIG. 6 is a circuit diagram of yet one more embodiment of a variable gain voltage signal amplifier in accordance with the invention.

Another desirable feature of a VGA incorporated in an AGC circuit for use in a disk drive includes having the magnitude of the gain increase exponentially as the control voltage increases. It may be shown that where this "idealized" situation is achieved, the overall settling time for the AGC loop and, hence, one component of the time necessary to read signals from the disk, is independent of the input voltage signal amplitude level. One technique or mechanism for achieving this desirable result includes employing electronic circuitry providing a piece-wise linear approximation to an exponentially increasing gain versus control signal characteristic. This feature may be incorporated into a variable gain voltage signal amplifier in accordance with the invention by replacing electronic signal-controlled resistors 150 and 160 in FIG. 3 with a network configuration of such devices coupled in parallel, such as described in aforementioned patent application Ser. No. 07/954839 entitled "Multiple Control Voltage Generation For MOSFET Resistors." One such embodiment 610 is illustrated in FIG. 6. As illustrated in FIG. 6, device 150 in FIG. 3 is replaced with a network of fixed resistors, such as 451, 453, and 455, and electronic signal-controlled resistors, implemented within MOS devices, such as 450, 452, 454 and 456. Device 160 from FIG. 3 is likewise replaced with a substantially similar network of fixed resistors 4511, 4531, and 4551, and MOS devices 4501, 4521, 4541 and 4561. The resistors and MOS devices are chosen so that the circuit will provide a piece-wise linear approximation to an exponentially increasing gain in response to control voltages $V_{c0}$, $V_{c1}$, $V_{c2}$, and $V_{c3}$. Likewise, an embodiment of a source-following circuit to provide these control voltages is illustrated comprising MOS devices 410, 411 and 412, and current sources 423, 424 and 425. It will be appreciated that the electrical characteristics of the components selected will substantially determine various aspects of the piece-wise linear approximation employed, such as the different slopes and breakpoints for the resulting piece-wise linear gain versus control signal curve. It will likewise now be appreciated that the invention is not limited in scope to this particular embodiment of a variable gain voltage signal amplifier in accordance with the invention. Many alternative embodiments in accordance with the invention may be employed.

Yet another aspect of a variable gain voltage signal amplifier in accordance with the invention relates to "squelching" the operation of the VGA for those situations in which the disk drive is engaged in a "write" operation, as opposed to a read operation. In the context of the invention, the term "squelch" refers to attenuating or blocking the signal transmission through the VGA. In the embodiment of a VGA such as illustrated in FIG. 2, this may be accomplished by introducing a "short circuit" electrical path across the amplifier input voltage signal terminals or across the terminals of resistor 15. Thus, the high impedance across the input voltage terminals of the amplifier is modified to a low impedance. This is desirable during a write operation because it is desirable to reduce the effect on the read channel of the large signal transients occurring during the write operation, in particular on the settling time of the DC bias levels associated with the capacitors coupling the disk drive head (not shown) to the VGA. Nevertheless, as may be illustrated by again referring to the block diagram of FIG. 1, once the write operation and squelching of the VGA is completed, it is also desirable for high-pass network 60 to resettle as quickly as possible at the conclusion of the write operation, or not need resettling, to begin another read operation.

Figure 5:
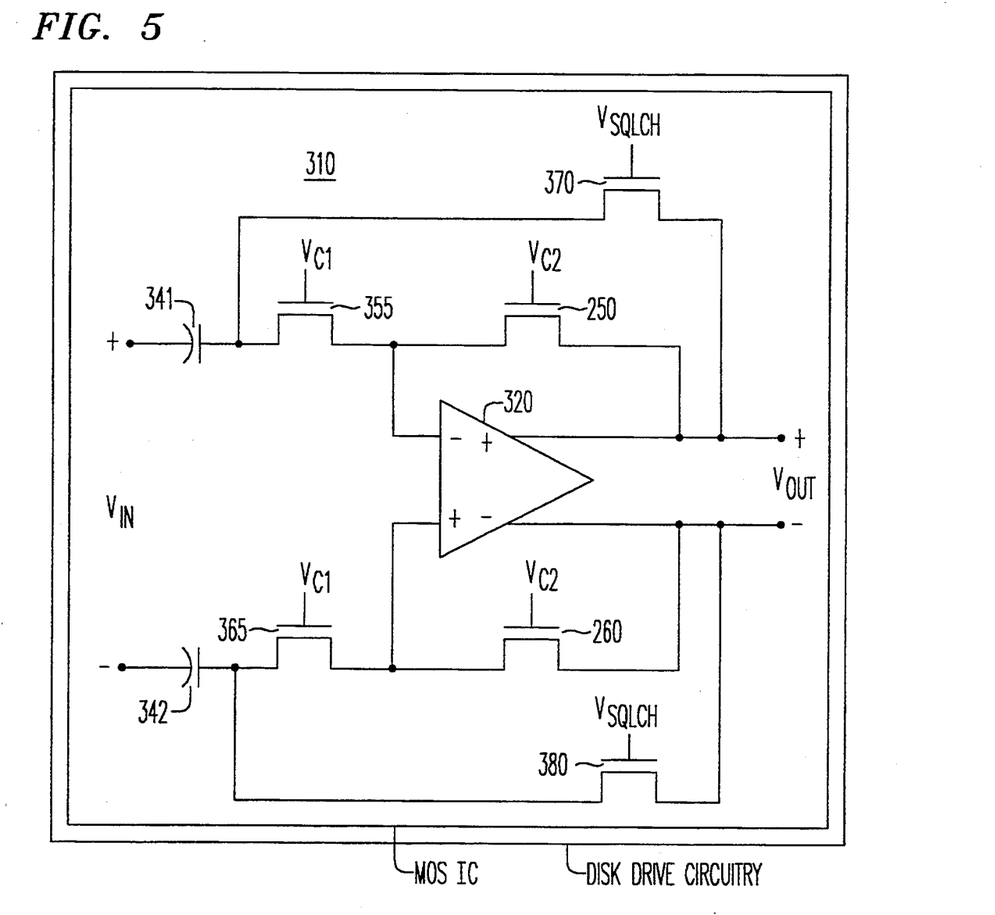
FIG. 5 is a circuit diagram of yet another alternative embodiment of a variable gain voltage signal amplifier in accordance with the invention.

One configuration for achieving this to reduce the impact on the overall operation of the AGC loop, in comparison with the approach previously discussed, is illustrated by the embodiment of a variable gain voltage signal amplifier in accordance with the invention in FIG. 5. VGA 3 10 illustrated in FIG. 5 is similar to VGA 210 illustrated in FIG. 4 with the additional feature that a first switch 370 is adapted to selectively couple between a plate or terminal of capacitor 341 in the first input signal path and the non-inverting output voltage signal terminal of balanced amplifier 320. Likewise, a second switch 380 is adapted to selectively couple between a terminal of capacitor 342 in the second input signal path and the inverting output voltage signal terminal of balanced amplifier 320. In the embodiment illustrated in FIG. 5, each switch comprises an MOS device in which the device operates as an electronic switch. This operation may be contrasted with the previously described use of such MOS devices as electrical or electronic signal-controlled resistances. In both situations, the invention is not restricted in scope to use of an MOS device. Nevertheless, because of the presence of MOS devices, the embodiment illustrated in FIG. 5 is shown incorporated on an MOS IC that is conveniently incorporated in a disk drive system.

As illustrated in FIG. 5, switches 370 and 380, when appropriately actuated by an electrical or electronic signal, may operate as an open circuit in those situations in which it is not desired to "squelch" the operation of the VGA. Likewise, when "squelch" is desired, such as during a write operation, switches 370 and 380 may be actuated to operate as an approximate short circuit. As is well-known in the art, a voltage signal applied to the gate of an MOS device of sufficient magnitude, designated $V_{SQLCH}$ in FIG. 5, may selectively change the state of the device from operating as an open circuit to operating as a short circuit electrical path. Thus, during such short circuit operation, the output voltage signal terminals of the balanced amplifier 320 are respectively coupled to capacitors 341 and 342 by respective switches 370 and 380. In steady state or equilibrium operation, as previously described, the capacitors should, in combination, be charged to a voltage level sufficient to provide a voltage signal substantially equal to the operational amplifier input "referred" internal offset voltage, $V_{os}$. Thus, by this technique, the DC offset of the output voltage signal produced at the output voltage terminal of the balanced amplifier is substantially unchanged. Likewise, the high-pass or RC network of the AGC circuit, such as illustrated in FIG. 1, or the AC coupling network coupled to the input terminals of the balanced amplifier, such as illustrated in FIG. 5, should not need to resettle between successive read and write operations of the disk drive.

The embodiment of a variable gain voltage signal amplifier in accordance with the invention illustrated in FIG. 5, thus has several desirable features. First, blocking capacitors 341 and 342 are each respectively coupled to a low impedance node so that at the completion of a write operation by the disk drive the capacitors may be quickly resettled to the desired DC potential or voltage. Settling is rapid because the capacitors are coupled to the output terminals of the balanced amplifier, which is a relatively low impedance source. Second, alternating current signal transmissions from the input voltage signal terminals to the output voltage signal terminals of the balanced amplifier are blocked. This prevents write operation voltage signals from propagating through the read channel of the disk drive because capacitors 341 and 342 are effectively coupled by a short circuit due to the negative feedback coupling of the balanced amplifier. Third, the DC output voltage offset of the VGA is substantially the same during squelch as during variable gain amplifier operation. Therefore, the AGC circuit does not need to significantly readapt between successive read and write operations.

Figure 9:
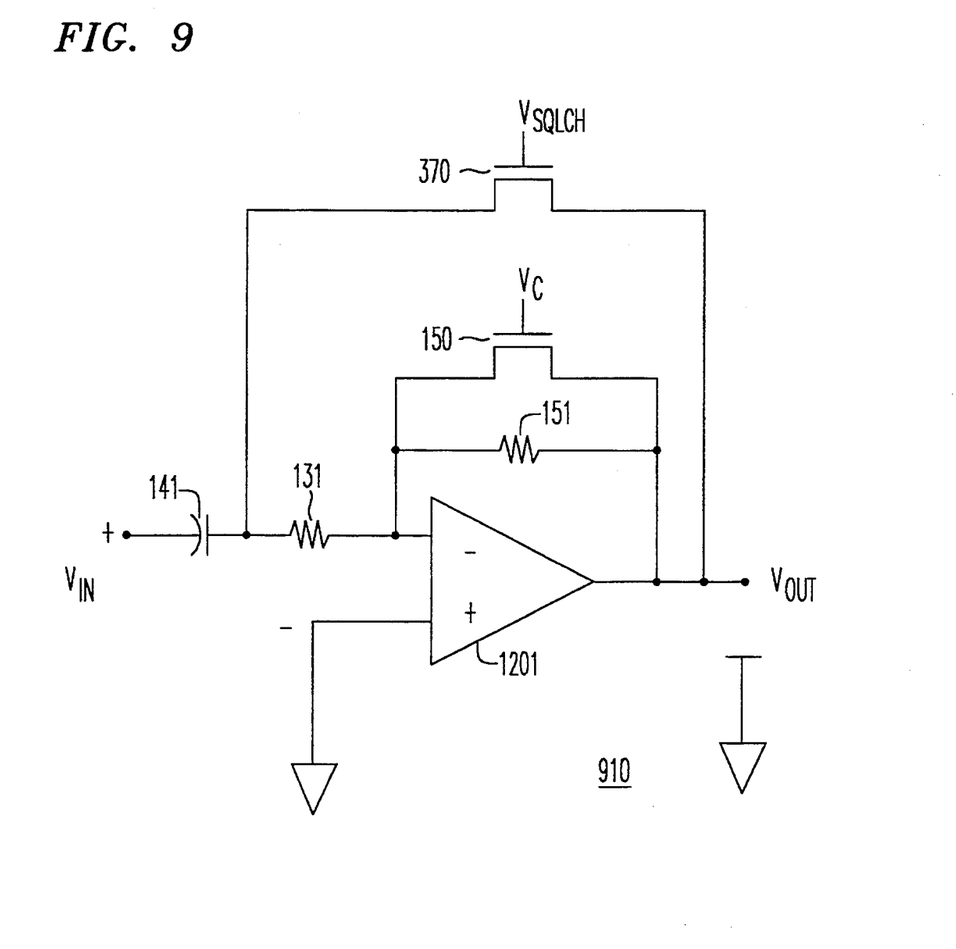
FIG. 9 is a circuit diagram of still yet another embodiment of a variable gain voltage signal amplifier in accordance with the invention.

Yet still another embodiment of a variable gain voltage signal amplifier in accordance with the invention may be implemented with a conventional "one-sided" operational amplifier 1201, instead of a balanced amplifier. Such an embodiment is illustrated in FIG. 9. VGA 910 operates as previously described except that amplifier 1201 has an inverting and non-inverting input voltage signal terminal and a non-inverting output voltage signal terminal, but no inverting output voltage signal terminal. Amplifier 1201 includes an input signal path coupled to the input voltage signal terminal and further includes a feedback signal path coupling between the input voltage signal terminal and the output voltage signal terminal. The input signal path comprises a capacitor 141 coupled in series with a resistor 131, much like FIG. 3. Likewise, the feedback signal path comprises a resistor, and at least one of the resistors comprises an electronic signal-controlled resistor. The embodiment illustrated in FIG. 9, like FIG. 5, also includes a switch 370 adapted to selectively couple capacitor 141 in FIG. 9 to the output voltage signal terminal in order to perform "squelch", as previously described.

Another aspect of a variable gain voltage signal amplifier incorporated in an AGC circuit for use in a disk drive, such as the embodiment illustrated in FIG. 1, relates to the capability to source and sink large amounts of current in order to maintain the DC voltage offset of the output voltage signal of the VGA, particularly during squelch mode. More particularly, the coupling capacitors, such as capacitors 141 and 145 illustrated in FIG. 3, may be large, such as on the order of 1,000 pF, and the amplifier may have a large bandwidth, such as in the order of 50 MHz. During squelch, such as the type illustrated in FIG. 5 and previously discussed, large voltage transient signals may occur at $V_{in}$ so that large amounts of current must be sourced through capacitors 141 and 145 in order to maintain $V_{out}$ substantially equal to $V_{os}$. This may introduce problems for a balanced amplifier implemented using MOS technology in terms of circuit stability and IC power dissipation. One approach to solving this problem is to use a slew enhancing circuit for the differential and common mode voltage signals of the balanced amplifier. Slew enhancement has been employed in other contexts, such as for amplifiers producing a single output voltage, in contrast with balanced amplifiers having both inverting and non-inverting output voltage terminals. Such "single-ended" circuits are described in "CMOS Amplifiers Incorporating A Novel Slew Rate Enhancement Technique," written by K. Nagaraj, and published in *The Proceedings of the IEEE* 1990 *Custom Integrated Circuit Conference*, herein incorporated by reference. Such a technique may be employed with the embodiment of a variable gain voltage signal amplifier in accordance with the invention illustrated in FIG. 9. Thus, balanced amplifier 120 illustrated in FIG. 3 may have a differential mode slewing circuit, such as an embodiment 700 of such a circuit illustrated in FIG. 7, coupled to its inverting and non-inverting input voltage terminals and coupled to its inverting and non-inverting output voltage terminals, so as to substantially maintain the charge on the capacitors in the first and second input signal paths substantially within a predetermined range of differential DC input voltage signals. Likewise, a common mode slewing circuit, such as an embodiment 800 illustrated in FIG. 8, may be coupled to the inverting and non-inverting output voltage terminals of the balanced amplifier so as to substantially maintain the charge on the capacitors substantially within a predetermined range of common mode DC input voltage signals. Nonetheless, in practice the slew enhancement circuitry operates or activates during squelch mode. Therefore, both the input and output voltage signals are affected. More specifically, where the difference between $V_A$ and $V_B$, the voltages at input voltage terminals A and B respectively, is excessive, for example, greater than 100 mV, the amplifier may exhibit non-linear slewing behavior. In this instance, circuit 700, coupled to the terminals of balanced amplifier 120, should operate to maintain the charge on the input path capacitors, for example capacitors 141 and 145 in FIG. 3, substantially within a predetermined range of differential DC input voltage signals that substantially maintains, and in some instances returns, the operation of amplifier 120 within a substantially linear amplification region.

Figure 7:
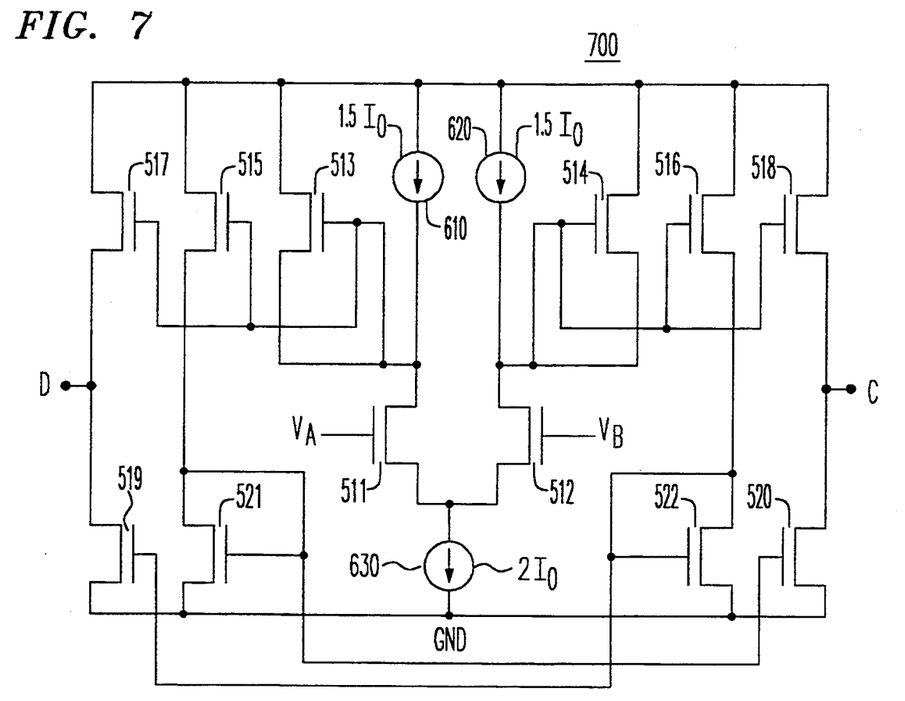
FIG. 7 is a circuit diagram of one embodiment of a differential mode slewing circuit such as for use in an embodiment of a variable gain voltage signal amplifier in accordance with the invention.

Referring now to FIG. 7, when balanced amplifier 120 is operating substantially within its linear differential region, $V_A \approx V_B$ so that $I_o$ flows through semiconductor device 511 and $I_o$ flows through semiconductor device 512, these semiconductor devices being gated by voltage signals $V_A$ and $V_B$. Current sources 610 and 620, each respectively providing a current magnitude of 1.5 $I_o$, operate to maintain semiconductor devices 513, 514, 515, 516, 517, 518, 519, 520, 521 and 522, so that substantially no current is sourced or sinked to nodes C and D illustrated in FIG. 7, corresponding, for example, to output voltage signal terminals C and D in FIG. 3. Nonetheless, if $V_A$ is substantially greater than $V_B$, the balanced amplifier may be operating in its non-linear amplification region. In this situation, in circuit 700, 2$I_o$ flows through semiconductor device 511 and semiconductor devices 512, 514, 516, 518, 522 and 519, are off. Likewise, 0.5 $I_o$ of current flows through semiconductor device 513 and is mirrored via semiconductor device 517 to node or output voltage terminal D and via semiconductor devices 515, 521 and 520 to node or voltage output terminal C. Thus, in this mode of operation, circuit 700 sources current to output voltage terminal D and sinks current from output voltage terminal C until capacitors 141 and 145 are charged up differentially, placing the operational amplifier substantially within its linear region of operation and resulting in the termination of slewing. Likewise, due to the symmetry of the circuit, if $V_B$ is substantially greater than $V_A$, the circuit should operate in a similar manner to charge capacitors 141 and 145 to substantially within the desired range of differential DC input voltage signals.

Figure 8:
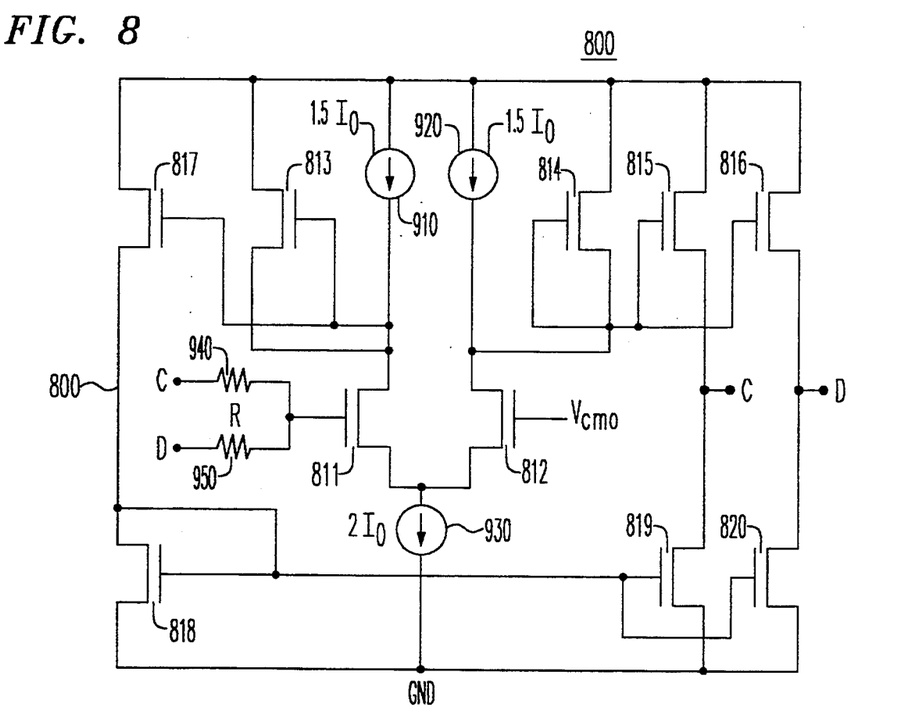
FIG. 8 is a circuit diagram of one embodiment of a common mode slewing circuit, such as for use in an embodiment of a variable gain voltage signal amplifier in accordance with the invention.

During normal or linear operation of balanced amplifier 120 in FIG. 3, one-half of ($V_C + V_D$), where $V_C$ and $V_D$ indicate the voltage signals at terminals C and D, should be relatively close to the common mode voltage signal level of the balanced amplifier. Thus, as previously described regarding embodiment 700 of a differential mode slewing circuit, if $\frac{1}{2}(V_c+V_D)$ differs greatly from the common mode voltage signal level of the balanced amplifier, a common mode slewing circuit, such as an embodiment 800 of such a circuit illustrated in FIG. 8, should activate. In this particular embodiment, the common mode voltage signal level of balanced amplifier 120 is compared with a reference voltage signal level, here $V_{cmo}$, as illustrated in FIG. 8. If $\frac{1}{2}(V_c+V_D)$ is approximately equal to the reference voltage signal level, semiconductor devices 811 and 812 each conduct $I_o$ current. Current sources 910 and 920 maintain semiconductor devices 813, 814, 815, 816, 817, 818, 819 and 820 so that substantially no current is sourced or sinked to output voltage terminals C and D. However, if the common mode voltage signal level of the output voltage terminals of balanced amplifier 120 deviates significantly from the desired voltage signal level, the circuit should operate to adjust the common mode voltage signal level, as described hereinafter. For example, if $\frac{1}{2}(V_c+V_D)$ is significantly greater than $V_{cmo}$, $2I_o$ should flow through semiconductor device 811 and semiconductor device 812 should be off. Likewise, $0.5 I_o$ should flow through semiconductor device 813 and be mirrored to output voltage terminals C and D via semiconductor devices 817, 818, 819 and 820. The output voltage terminals of the balanced amplifier will then sink current until $\frac{1}{2}(V_c+V_D)$ is decreased to a level substantially equal to $V_{cmo}$. Likewise, if $\frac{1}{2}(V_c+V_D)$ is Significantly less than the reference voltage signal level, current should instead be sourced from output voltage terminals C and D until the common mode voltage signal level of balanced amplifier 120 is reached, as desired.

While only certain features of the invention have been illustrated and described herein, many modifications, substitutions, changes, or equivalents will now occur to those skilled in the art. It is, therefore, to be understood that the appended claims are intended to cover all such modifications and changes as tall within in the true spirit of the invention.

We claim:

1. An integrated circuit comprising:
    an amplifier including an inverting input voltage signal terminal and an output voltage signal terminal; and
    a switch;
    said amplifier including an input signal path coupled to said input voltage signal terminal and a feedback signal path coupling between said input voltage signal terminal and said output voltage signal terminal;
    said input signal path comprising a capacitor coupled in series with a resistor;
    said feedback signal path comprising another resistor;
    at least one of said resistors comprising an electronic signal-controlled resistor;
    said switch being adapted to selectively couple between the capacitor in said input signal path and said output voltage signal terminal.

2. A variable gain voltage signal amplifier, incorporated in an automatic gain control circuit, for varying the amplifier gain between an alternating current input voltage signal and an alternating current output voltage signal of said variable gain amplifier without substantially affecting the magnitude of a direct current output voltage signal offset of said variable gain amplifier, said variable gain amplifier comprising:
    a balanced amplifier including inverting and non-inverting input voltage signal terminals and inverting and non-inverting output voltage signal terminals;
    said balanced amplifier including a first input signal path and a second input signal path respectively coupled to said inverting input voltage signal terminal and said non-inverting input voltage signal terminal;
    said balanced amplifier further including a first feedback signal path and a second feedback signal path respectively coupling between said inverting input voltage signal terminal and said non-inverting output voltage signal terminal and between said non-inverting input voltage signal terminal and said inverting output voltage signal terminal;
    each of said first and second input signal paths respectively comprising a capacitor coupled in series with a resistor;
    each of said first and second feedback signal paths respectively comprising a resistor; and
    at least one of the resistors in the first signal path and in the second signal path comprising an electronic signal-controlled resistor.

3. The variable gain voltage signal amplifier of claim 2, and further comprising a first switch and a second switch;
    said first switch being adapted to selectively couple between the capacitor in said first input signal path and said non-inverting output voltage signal terminal; and
    said second switch being adapted to selectively couple between the capacitor in said second input signal path and said inverting output voltage signal terminal.

4. The variable gain voltage signal amplifier of claim 3, wherein the other resistors in the first signal path and in the second signal path each comprise an electronic signal-controlled resistor.

5. The variable gain voltage signal amplifier of claim 3, wherein at least one of the electronic signal-controlled resistors comprises a metal oxide semiconductor (MOS) device.

6. The variable gain voltage signal amplifier of claim 3, wherein at least one of said switches comprises a metal oxide semiconductor (MOS) device.

7. The variable gain voltage signal amplifier of claim 6, wherein each of said switches and said electronic signal-controlled resistors comprises an MOS device.

8. The variable gain voltage signal amplifier of claim 7, wherein an MOS integrated circuit incorporates said variable gain voltage signal amplifier.

9. The variable gain voltage signal amplifier of claim 8, wherein said MOS integrated circuit is incorporated in a disk drive system.

10. The variable gain voltage signal amplifier of claim 3, wherein said balanced amplifier is responsive to a predetermined range of differential direct current (DC) input voltage signals;
    and further comprising a differential mode slewing circuit being coupled to the voltage terminals of said balanced amplifier so as to substantially maintain the charge on the capacitors in said first and second input signal paths substantially within said predetermined range of differential DC input voltage signals.

11. The variable gain voltage signal amplifier of claim 3, wherein said balanced amplifier is responsive to a predetermined range of common mode direct current (DC) input voltage signals;

and further comprising a common mode slewing circuit being coupled to said inverting and non-inverting output voltage signal terminals so as to substantially maintain the charge on the capacitors substantially within said predetermined range of common mode DC input voltage signals.

12. The variable gain voltage signal amplifier of claim 2, wherein the capacitor in said first and second input signal paths, respectively, comprises a capacitor having an effective capacitance sufficient to substantially filter out direct current voltage signals and low frequency alternating current voltage signals substantially outside a predetermined relevant range of frequencies for said automatic gain control circuit.

13. The variable gain voltage signal amplifier of claim 2, wherein said resistors including said electrical-signal controlled resistors are selected so that said variable gain voltage signal amplifier is adapted to provide a piece-wise linear approximation to an exponentially increasing gain versus electronic control signal characteristic.

14. A method of using an amplifier in a variable gain voltage signal amplifier incorporated in an automatic gain control circuit to vary the gain between an alternating current input voltage signal and an alternating current output voltage signal of said variable gain amplifier without substantially affecting the magnitude of a direct current output voltage signal offset of said variable gain amplifier;

said variable gain voltage signal amplifier comprising:
an electronic switch and an amplifier including an inverting input voltage signal terminal and an output voltage signal terminal, said amplifier including an input signal path coupled to said input voltage signal terminal, said amplifier further including a feedback signal path coupling between said input voltage signal terminal and said output voltage signal terminal, said input signal path comprising a capacitor coupled in series with a resistor, said feedback signal path comprising a resistor, at least one of the resistors comprising an electronic signal-controlled resistor, said electronic switch being adapted to selectively couple between the capacitor in said input signal path and said output voltage signal terminal;

said method comprising the steps of:
adjusting the electronic signal of said electronic signal-controlled resistor; and
electronically actuating said switch so as to couple the capacitor in said input signal path to said output voltage signal terminal.

15. A method of using a pair of switches to squelch a variable gain voltage signal amplifier incorporated in an automatic gain control circuit without substantially affecting the magnitude of a direct current output voltage signal offset of said variable gain amplifier;

said variable gain amplifier having a first input voltage signal terminal, a second input voltage signal terminal, a first output voltage signal terminal, and a second output voltage signal terminal;

a first input signal path and a second input signal path being respectively coupled to said first and second input voltage signal terminals, said input signal paths each including a capacitor, the first switch of said pair of switches being adapted to selectively couple between said first input voltage signal terminal and said first output voltage signal terminal and the second switch of said pair of switches being adapted to selectively couple between said second input voltage signal terminal and said second output voltage signal terminal;

said method comprising the step of actuating said switches so as to couple said input voltage signal terminals to said output voltage signal terminals.

16. The method of claim 15, wherein each of said switches comprises an electronic-signal actuated switch; and
wherein the step of actuating said switches comprises electronically actuating said switches.

17. A method of using a balanced amplifier in a variable gain voltage signal amplifier incorporated in an automatic gain control circuit to vary the gain between an alternating current input voltage signal and an alternating current output voltage signal of said variable gain amplifier without substantially affecting the magnitude of a direct current output voltage signal offset of said variable gain amplifier;

said variable gain voltage signal amplifier comprising a balanced amplifier including inverting and non-inverting input voltage signal terminals and inverting and non-inverting output voltage signal terminals, said balanced amplifier including a first input signal path and a second input signal path respectively coupled to said inverting input voltage signal terminal and said non-inverting input voltage signal terminal, said balanced amplifier further including a first feedback signal path and a second feedback signal path respectively coupling between said inverting input voltage signal terminal and said non-inverting output voltage signal terminal and between said non-inverting input signal terminal and said inverting output signal terminal;

each of said first and second input signal paths respectively comprising a capacitor coupled in series with a resistor, each of said first and second feedback signal paths respectively comprising a resistor, at least one of the resistors in the first signal path and in the second signal path comprising an electronic signal-controlled resistor;

said method comprising the step of adjusting the electronic signals of the electronic signal-controlled resistors.

18. The method of claim 17, wherein said variable gain voltage signal amplifier further comprises a first electronic switch being adapted to selectively couple between the capacitor in said first input signal path and said non-inverting output voltage signal terminal, and a second electronic switch being adapted to selectively couple between the capacitor in said second input signal path and said inverting output voltage signal terminal; and said method further the comprising the step of electronically actuating said switches so as to couple the capacitors in said input signal paths to said output voltage signal terminals.

* * * * *